United States Patent
Neji et al.

(10) Patent No.: US 10,024,941 B2
(45) Date of Patent: Jul. 17, 2018

(54) MAGNETIC RESONANCE SPECTROSCOPY WITH SHORT ECHO TIME

(71) Applicant: Siemens Aktiengesellschaft, Munich (DE)

(72) Inventors: Radhouene Neji, London (GB); Nashiely Sofia Pineda Alonso, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 682 days.

(21) Appl. No.: 14/713,339

(22) Filed: May 15, 2015

(65) Prior Publication Data

US 2015/0331076 A1    Nov. 19, 2015

(30) Foreign Application Priority Data

May 16, 2014   (DE) .................. 10 2014 209 351

(51) Int. Cl.
| | |
|---|---|
| *G01V 3/00* | (2006.01) |
| *G01R 33/483* | (2006.01) |
| *G01R 33/567* | (2006.01) |
| *G01R 33/48* | (2006.01) |
| *G01R 33/565* | (2006.01) |
| *G01R 33/485* | (2006.01) |

(52) U.S. Cl.
CPC ....... *G01R 33/4835* (2013.01); *G01R 33/485* (2013.01); *G01R 33/4828* (2013.01); *G01R 33/5673* (2013.01); *G01R 33/56509* (2013.01); *G01R 33/5676* (2013.01)

(58) Field of Classification Search
CPC .................................................. G01R 33/4816
USPC ......................................... 324/309, 307, 306
See application file for complete search history.

(56) References Cited

U.S. PATENT DOCUMENTS

| 5,514,957 A | * | 5/1996 | Tatebayashi | G01R 33/54 324/307 |
| 6,900,634 B2 | * | 5/2005 | Roell | G01R 33/5615 324/309 |
| 7,777,488 B2 | * | 8/2010 | Gore | G01R 33/4824 324/307 |

(Continued)

OTHER PUBLICATIONS

Pineda et al., "Measurement of Hepatic Lipid: High-Speed T2-Corrected Multiecho Acquisition at 1H MR Spectroscopy—A Rapid and Accurate Techniquel," Radiology, vol. 252, No. 2, pp. 568-578 (2009).

(Continued)

*Primary Examiner* — Louis Arana
(74) *Attorney, Agent, or Firm* — Schiff Hardin LLP

(57) ABSTRACT

In a method and apparatus for generating magnetic resonance spectroscopy data from a VOI, in particular in the liver, image data are acquired from an examination area, which contains an organ affected by breathing, and the image data are evaluated until the position of the organ lies within a specific region. One or more of the eight acquisition cycles of an ISIS sequence are executed in order to acquire magnetic resonance spectroscopy data from the VOI, with repetitions until all eight acquisition cycles of the ISIS sequence have been executed. The magnetic resonance spectroscopy data acquired with the ISIS sequence are reconstructed to form a spectrum. The data acquisition has an ultra-short echo time.

15 Claims, 3 Drawing Sheets

(56) References Cited

U.S. PATENT DOCUMENTS

2018/0055405 A1* 3/2018 Peacock, III .......... A61B 5/748

OTHER PUBLICATIONS

Lamb et al., Reproducibility of Human Cardiac 31P-NMR Spectroscopy, NMR in Biomedicine, vol. 9, pp. 217-227 (1996).
Ordidge et al., "Image-Selected in Vivo Spectroscopy (ISIS). A New Technique for Spatially Selective NMR Spectroscopy," Journal of Magnetic Resonance, vol. 66, pp. 283-294 (1986).

* cited by examiner

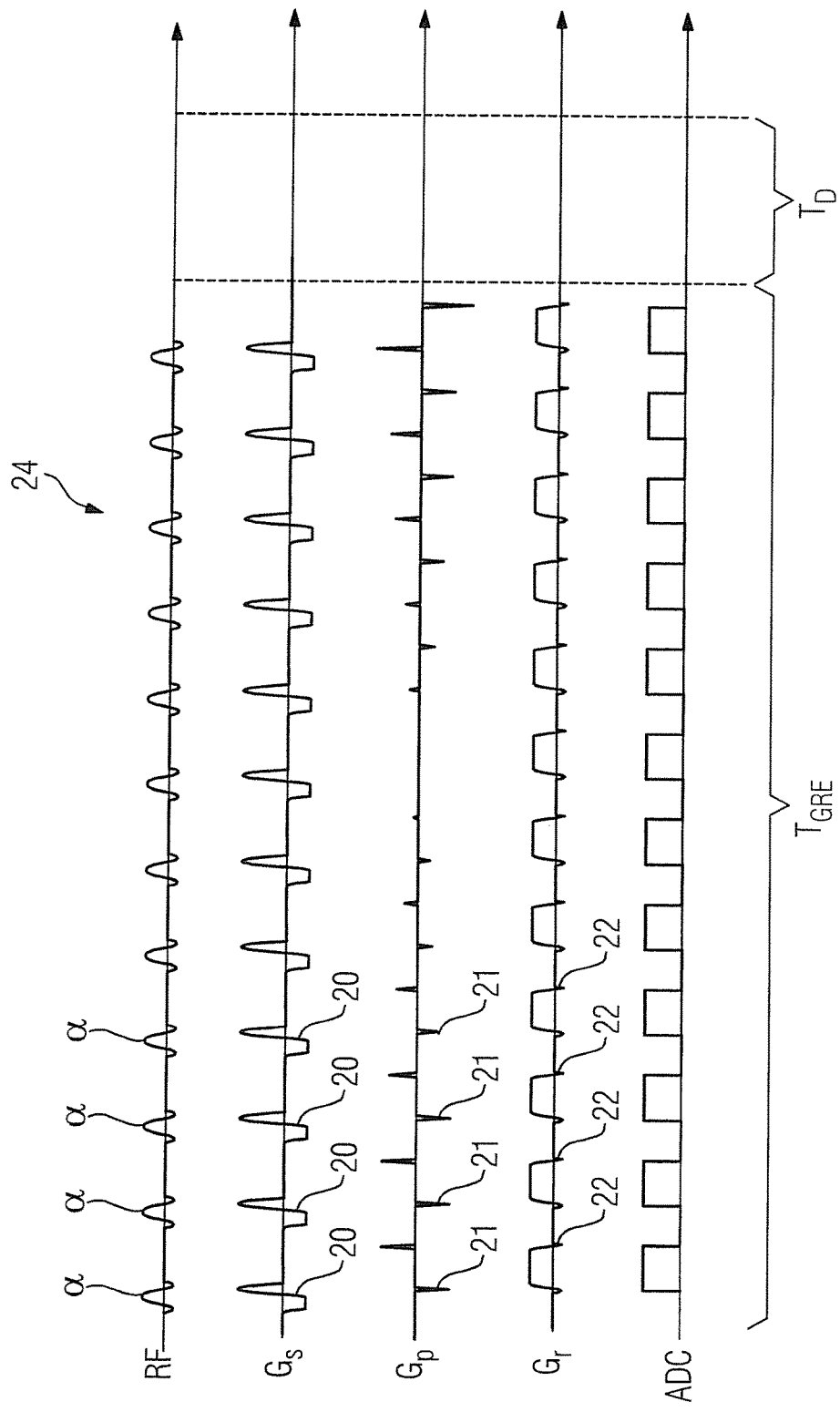

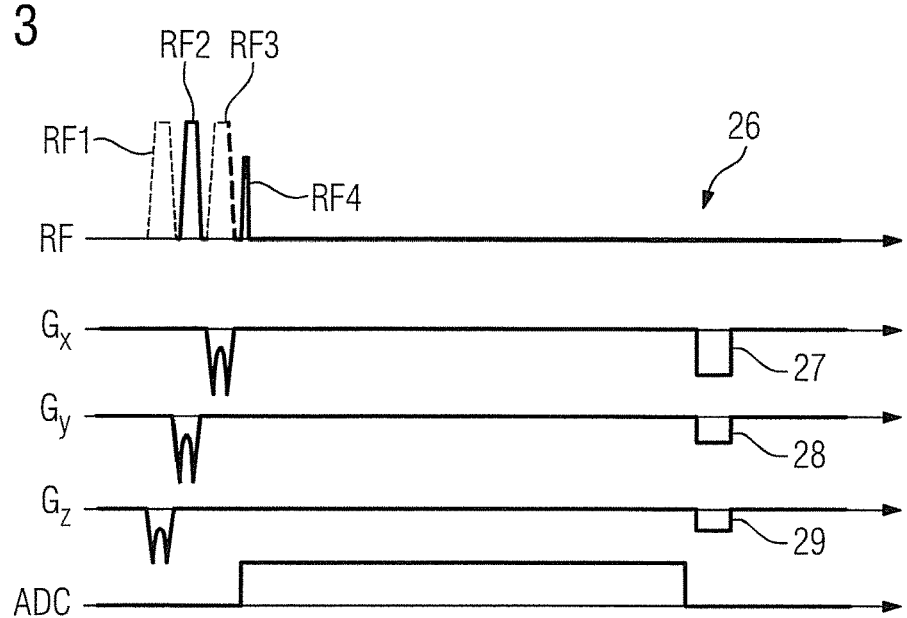
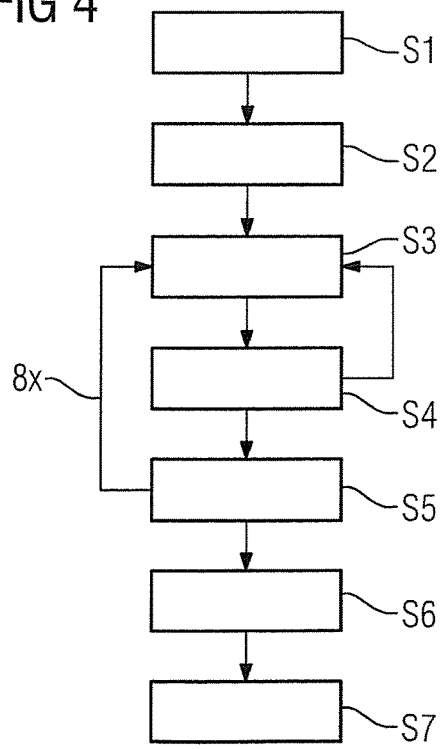

MAGNETIC RESONANCE SPECTROSCOPY WITH SHORT ECHO TIME

BACKGROUND OF THE INVENTION

1. Field of the Invention

The invention concerns a method for generating magnetic resonance spectroscopy data from a volume of interest in the body of a person to be examined with as short an echo time as possible as well as a magnetic resonance system and a digital data storage medium encoded with programming instructions, to implement such a method.

2. Description of the Prior Art

The inventive method is applied in particular to the magnetic resonance spectroscopy of the liver. Diseases of the liver are often associated with an increased fat content in the liver, e.g. liver diseases as a result of obesity. The determination of the fat content in the liver is of great interest as a detail in the diagnosis. $^1$H-magnetic resonance spectroscopy (MRS) provides a means of determining the fat content of the liver in a non-invasive manner and may be very sensitive to small quantities or smaller changes in the hepatic fat content.

One problem with determining the fat content in the liver by means of $^1$H-MRS is the variability in the T2 relaxation time. Single-voxel spectroscopy (SVS) normally requires sequences which excite a volume of interest (VOI) or voxels within the liver by means of three slice-selective pulses and acquire a signal from this volume, a relatively long echo time (TE). In the case of a single-voxel STimulated Echo Acquisition mode (STEAM) sequence, three consecutive 90° pulses are used for instance and a stimulated echo is recorded thereafter. The shortest possible echo time in this method is however in the range above 10 ms If patients differ significantly in terms of T2 relaxation time, for instance due to different iron contents in the liver, this results in significant errors in the determination of the relative fat content in the liver.

In the Article by Pineda, P. Sharma, Q. Xu, X. Hu, M. Vos and D. Martin "Measurement of Hepatic Lipid: High-Speed T2-Corrected Multiecho Acquisition at $^1$H MR Spectroscopy—A Rapid and Accurate Technique", Radiology: Vol. 252: No. 2 (August 2009), the STEAM sequence is therefore repeated with different echo times and an exponential decay curve is fitted into the acquired spectra on the integral below the fat and water signal, said decay curve forming the T2 relaxation. The signal can thus be extrapolated at time instant TE=0 and the T2 effect can thus be calculated therefrom. This method nevertheless requires the multiple repetition of the spectroscopy measurement, wherein the results are not added so as to increase the signal-to-noise (SNR) ratio but are used again to determine a further parameter (T2). Relatively long acquisition times and large VOIs are therefore offered using this technique.

SUMMARY OF THE INVENTION

An object of the invention is to provide a method, an apparatus, and a storage medium that allow for generation of magnetic resonance spectroscopy data with an ultra-short echo time, but without the aforementioned disadvantages of the prior art. An object of the invention is in particular to provide a method in which T2 effects have no role. Furthermore, the method should allow the generation of MRS data with a high signal-to-noise ratio and thus provide for short measurement times and small VOIs.

Furthermore, an object of the invention is to provide a corresponding method for generating MRS data, in which the person to be examined does not have to hold his/her breath, as is usually required during the acquisition of MR data from the abdomen or ribcage area.

The inventive method uses what is known as the ISIS sequence (Image-selected In vivo Spectroscopy), which was originally developed for the $^{31}$P-Magnetic resonance spectroscopy, which has to operate with ultra-short T2 relaxation times. The ISIS sequence was first described in the Article by R. J. Ordidge, A. Connelly, J. A. B. Lohman: "Image-Selected In vivo Spectroscopy (ISIS): A New Technique for Spatially Selective NMR Spectroscopy, Journal of Magnetic Resonance, 66:283-294 (1986). In this sequence, the volume of interest (VOI) is selected by slice-selective 180° pulses, followed by a non-selective 90° pulse, after which a free induction decay (FID) is recorded. By using 180° pulses, without generating substantial magnetization in the xy plane, T2 effects have practically no role. The echo time is only the very short period of time between the 90° pulse and the switching-on of the ADCs (analog-to-digital converter) and is therefore ultra-short. In order for the volume to be selected by the 180° pulses, the sequence must typically be repeated eight times, wherein one or several of the 180° pulses are deactivated in each repetition. With three pulses, eight combination possibilities are produced here. The corresponding FIDs are added and subtracted here respectively such that the signals, which do not originate from the volume of interest, cancel each other out.

In the case of measurements in the liver, breathing artifacts are also to be taken into account. MR measurements are usually implemented in breath-holding mode. This is, however, not possible with all patients and further lengthens the overall measurement time. The inventive method therefore allows for eight acquisition cycles of the ISIS sequence to be performed automatically in the same breathing position in the case of a freely breathing patient. To this end, one- or two-dimensional image data of an examination region is acquired, which contains the diaphragm of the person to be examined. After each acquisition, the image data is evaluated immediately with the aim of determining the position of the diaphragm. Since this only concerns a relative change in position between consecutively recorded image data, this can take place automatically. The steps of acquiring one-dimensional (1D) or two-dimensional (2D) image data and their evaluation are repeated until the position of the diaphragm is within a specific region. This region is preferably automatically determined in a short "learning phase", namely preferably as the position in which the person spends the longest during each breath of air. This is typically the breathed-out position.

If it is thus determined that the position of the diaphragm is within a specific region, the ISIS sequence is triggered immediately. One or, if necessary, two or more of the eight acquisition cycles of an ISIS sequence are thus run in order to acquire magnetic resonance spectroscopy data from the volume of interest (VOI).

1D or 2D image data of the examination region are subsequently acquired and evaluated in order to determine the position of the diaphragm. If the position of the diaphragm lies within the specific region, further acquisition cycles of the ISIS sequence are run until all eight acquisition cycles of the ISIS sequence are complete. Finally, the magnetic resonance spectroscopy data acquired with the ISIS sequence are reconstructed to form a spectrum by the suitable adding and subtracting of the FID's of the individual acquisition cycles, Fourier transformation and if necessary suitable filtering or phase correction steps.

The claimed steps are preferably implemented consecutively in the specified sequence.

The inventive method is advantageous because the measurements are performed with an ultra-short echo time TE. The echo time is preferably <1 ms, particularly preferably <0.5 ms. An echo time of approx. 0.3 ms may even be achieved.

Since the eight acquisition cycles each result in an adding of the signal from the volume of interest and are thus averaged one on top of the other, the signal-to-noise ratio of the magnetic resonance spectroscopy data, which was created with the inventive method, is particularly good. This allows for the use of smaller VOIs, for instance <20 ml, preferably <10 ml, for instance 20 mm×20 mm×20 mm.

The measurement is not dependent on the T2 effects and J modulations on account of the short echo time. The results, for instance if they are used to determine the fat content in the liver, are for the same reason not dependent on the presence of iron in the liver, since with the ultra-short echo time, the T2 effects of iron are negligible.

A further advantage of the inventive method is that it can be implemented when the person to be examined is breathing freely, in other words with patients who are unable to hold their breath for physical or mental reasons.

The volume of interest is preferably in the liver of the person to be examined. In order to determine the fat content of the liver, in accordance with a preferred embodiment, the ratio between the fat signal and water signal plus fat signal in the spectrum is preferably determined. This can take place in various ways, for instance by determining the peak height in the spectrum. An integration below the peak of fat and water is particularly common. The ratio of the integral below the fat signal relative to the total of the integrals below water and fat then produces a value for the fat content of the liver.

Alternatively, the method can be implemented with a volume of interest in another part of the body, in particular a part affected by breathing artifacts, for instance in another organ in the abdomen or ribcage.

Each acquisition cycle of the ISIS sequence is preferably triggered by a navigator method. This can be a PACE (prospective-acquisition-correction)-based method.

According to a preferred embodiment, one- or two-dimensional image data are acquired in the diaphragm of the person to be examined. One-dimensional image data is a rod-type volume, which is laid through the diaphragm. The use of 2D image data is however particularly preferred. This is recorded in accordance with a preferred embodiment with a rapid gradient echo sequence and furthermore for instance with a minimal resolution and low flip angle. Because of the low resolution, the gradient echo sequence is particularly quick, e.g. an image can be acquired in less than 100 ms, for instance within 8 ms. The low flip angle ensures that the magnetization in the examination region is not saturated. Other rapid imaging sequences are however also conceivable, for instance turbo spin echo sequences.

Navigator methods of this type can be used for motion correction. A control is performed using the 1D or 2D image data to determine whether the patient has also not moved or has not breathed, before the actual measurement starts. All acquisition steps of the inventive method are preferably performed, while the person to be examined breathes freely.

Preferred features of the ISIS sequence are described below. The three slice-selective 180° pulses preferably each excite a slice, wherein the combined volume of the three slices is the volume of interest. The 180° pulses are typically "soft" pulses, since they are frequency-selective and are applied while simultaneously applying a gradient field, as known in magnetic resonance technology. The slice-selective 180° pulses may be adiabatic pulses.

According to one embodiment, three slice-selective 180° pulses are radiated one after the other, nevertheless 0-3 of the pulses are deactivated in the eight acquisition cycles. All eight possible combinations are herewith run in various acquisition cycles. According to the slice-selective 180° pulses, a non-selective radio frequency pulse is applied, for instance a 90° pulse and an FID is subsequently recorded.

Different combinations of up to three slice-selective 180° pulses are radiated one behind the other in each of the eight acquisition cycles of the ISIS sequence in each instance. The FIDs of the various eight acquisition cycles are added to or subtracted from one another in order to obtain a signal originating exclusively from the volume of interest.

The person to be examined is expediently positioned in the magnetic resonance scanner prior to the afore-described method steps, thereupon one or a number of sectional images are recorded through the body by rapid imaging, based on which the examination region and the volume of interest are positioned. Rapid sectional images of this type are also referred to as localizers.

The invention also encompasses a magnetic resonance system having a scanner in which the patient is received. The scanner has at least one gradient coil for generating a gradient field, at least one RF transmit coil for generating radio frequency pulses, and a control computer. The control computer is configured to cause the inventive method to be implemented.

The invention also encompasses on a digital, non-transitory storage medium encoded with a software program (programming instructions) with program code sections that cause a magnetic resonance system to implement the inventive method when the storage medium is loaded into a control computer of the magnetic resonance system and the programming instructions are executed.

BRIEF DESCRIPTION OF THE DRAWINGS

FIG. 2 shows a sequence diagram of an embodiment of a first part of the inventive method.

FIG. 3 shows a sequence diagram of an embodiment of a second part of the inventive method.

FIG. 4 is a flowchart of an embodiment of the inventive method.

DESCRIPTION OF THE PREFERRED EMBODIMENTS

Figure 1:
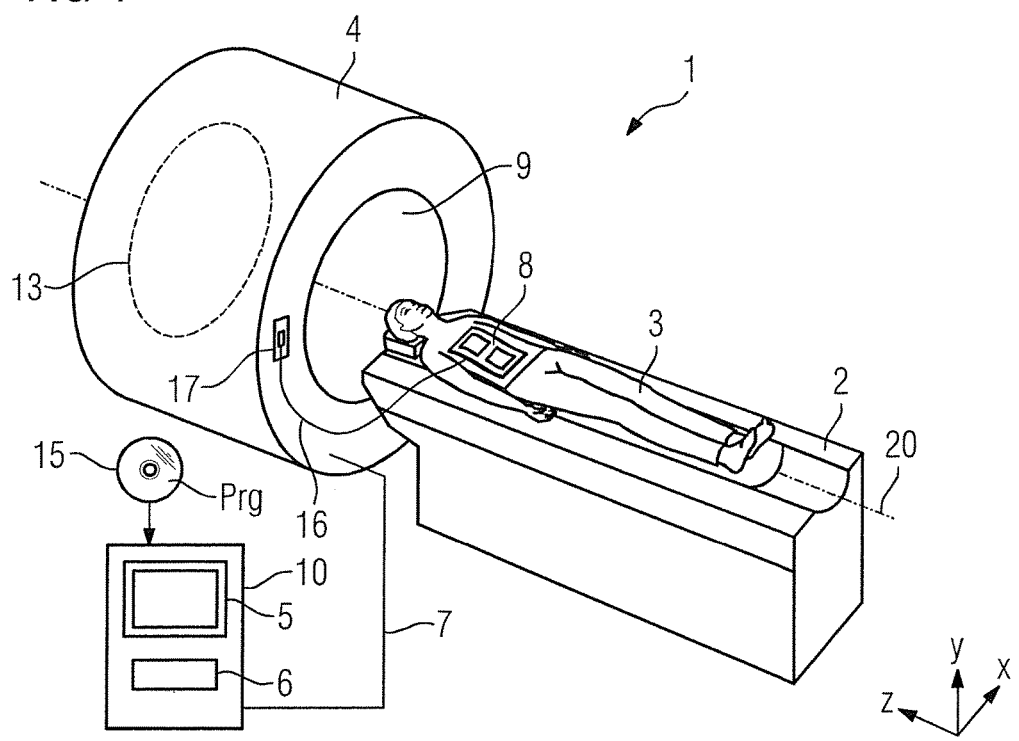
FIG. 1 shows a simplified perspective representation of a magnetic resonance system, with which the inventive method can be executed.

With reference to FIG. 1, an inventively embodied magnetic resonance system 1 in the embodiment shown has a scanner formed by a main magnet 4 with an interior 9. Further components, such as a gradient system 13 and a radio-frequency body coil (not shown) are integrated into the main magnet 4. A strong basic magnetic field is generated by the main magnet 4, which allows for the acquisition of magnetic resonance data within the tube-shaped main magnet 4. The basic magnetic field is typically aligned along the z-direction.

A patient 3 lies on a patient bed 2, which can be moved along the device axis 20 into the interior 9 in order to perform MR measurements. A body coil 8, which is connected to the connector 17 by a cable 16, is placed on the patient 3. The body coil 8 allows for the acquisition of both magnetic resonance spectroscopy data and MR image data of the torso of the patient, and therebelow also of organs such as the liver.

Further components of the magnetic resonance system, such as e.g. ADCs, frequency generators, amplifiers, filters and other converters, are well known and are not shown in FIG. 1.

The magnetic scanner is controlled by a control computer 6, which conveys control signals to the individual components of the magnetic resonance scanner via lines indicated schematically by 7. The control computer 6 is typically integrated in a control console 10. It is typically part of a larger computer, for instance the central computing unit, such as a CPU. Memory modules, e.g. a hard disk or a RAM or other data memories for storing predetermined values, sequence protocols, pulse profiles etc. can also be part of the control computer 6.

The control console 10 furthermore has a monitor 5 and, if necessary, input units, such as a touchscreen, keyboard, mouse or touchpad (not shown), which allow a user to enter data. A software program, which contains program code sections Prg for implementing the inventive method, can be stored on a digital storage medium 15, for instance a digital, optical or magnetic data memory, e.g. a CD-ROM, and may as a result be loaded into the control unit 6. Alternatively, the software program may also be loaded from a remote server or the cloud.

FIG. 2 shows an exemplary embodiment of an imaging sequence 24, which can be used for the acquisition of 2D image data within the scope of the navigator method. RF stands for radio frequency in FIG. 2, $G_s$ for layer gradient, $G_p$ for phase gradient and $G_r$ for read gradient. The line ADC indicates when the ADC is switched on and thus a signal is acquired. This is a gradient echo sequence with a small flip angle α, which lies between 5° and 20° for instance. While the excitation pulse a is irradiated by a radio-frequency coil 8, a layer gradient 20 is in each instance applied in a first spatial direction in order to select a layer. A phase gradient 21 is then applied in a direction which is orthogonal hereto, which is reversed again after each signal acquisition. The strength of the phase gradient after the individual excitation pulses a is different in each case in order to actuate different lines of the k-space. After the phase gradient, an orthogonal read gradient 22 is in each case connected and a signal is recorded at the same time with the ADC.

With the sequence shown, only twelve lines of k-space are read out, this may however be sufficient to reconstruct an image with a lower resolution. The purpose of this image is only to define the position of the organ subject to breathing, in other words in particular the diaphragm. A moderate image quality is therefore also sufficient in some circumstances. The overall duration of the gradient echo sequence $T_{GRE}$ amounts to between 50 and 100 ms, for instance 80 ms. A pause $T_D$ follows, within which the acquired image data is reconstructed, which practically takes place in real-time and are accordingly evaluated. If it is determined that the organ subject to breathing is not located in the position in which the acquisition of the magnetic resonance spectroscopy data is to take place, after completion of $T_D$, the gradient echo sequence is repeated.

If however this determines that the position of the organ lies within a specific region, in other words in the breath-out position, within which the patient is expected to remain for a short period of time, a first acquisition cycle of an ISIS sequence is thus implemented.

The ISIS sequence 26, which follows on from $T_D$ if necessary, is shown in FIG. 3. The gradients are named $G_x$, $G_y$ and $G_z$, since the gradient fields can run here in other directions than those during the imaging sequence in FIG. 3. The gradients here determine the selection of three layers, which intersect the volume of interest (VOI), from which MR spectroscopy data is to be acquired.

In the sequence 26 shown in FIG. 3, the gradients $G_z$, $G_y$ and $G_x$ are switched one after the other. A radio frequency 180° pulse is applied, if necessary, at the same time as the respective gradient fields, or is not radiated, depending on the repetition within the eight acquisition cycles. In the cycle shown, only a 180° pulse is radiated, namely RF2, which is radiated at the same time as gradients in the y-direction. In other acquisition cycles, the 180° pulse RF1 is applied at the same time as z-gradients $G_z$ or the 180° pulse RF3 at the same time as the x-gradients $G_x$. The 180° pulses RF1, RF2 and RF3 are each frequency-selective, soft pulses, for instance adiabatic pulses.

After the desired VOI was selected in this way, a radio frequency pulse RF4 is radiated, which is not slice selective. This is preferably a hard 90° pulse. The ADC is switched on directly thereafter and an FID (free induction decay) is acquired. After terminating the acquisition, spoiler gradients 27, 28, 29 are connected, in order to destroy the remaining residual magnetism so that it does not result in artifacts with subsequent measurements.

FIG. 4 shows a flow diagram of an embodiment of the inventive method. In step S1, the person or patient to be examined is positioned in the interior 9 of the magnetic resonance system 1 and localizer images are recorded.

The examination region which contains an organ of the person affected by breathing, for instance the diaphragm, is selected in step S2 from these localizer images. The alignment, e.g. the 2D image, on which the position of this organ is in each instance to be determined, is also determined. Furthermore, the volume of interest is also selected, for instance positioned in the liver or another organ.

The actual acquisition starts in step S3, namely with the acquisition of image data of the examination region, for instance with a rapid gradient echo sequence. This image data is reconstructed if possible in real time in step S4 and evaluated in order to determine the position of the organ affected by breathing. If necessary, steps S3 and S4 are repeated multiple times in order to trace the position of the organ during the breathing cycle and to automatically define a specific region, which is suited to the acquisition of spectroscopy data (learning phase). Subsequently steps S3 and S4 continue to be performed until the organ lies within this specific region. Then, in step S5, at least one of the eight acquisition cycles of an ISIS sequence is run. The method then reverts to step S3 and repeats the navigator steps, in other words the acquisition of image data and the determination of the position of the organ affected by breathing. If the patient has the correct breathing position, step S5 is in turn triggered, wherein this time the next of the eight acquisition cycles of an ISIS sequence is run. If all eight steps were run in this way, the method can optionally be repeated in order to average still more data and thus further improve the SNR. If sufficient spectroscopy data was acquired, this is reconstructed in step S6 to form a spectrum, in this way the data acquired in the various acquisition cycles of the ISIS sequence are added or subtracted according to a specific scheme so that only the signal is added from the volume of interest, but the signals from the surrounding tissue cancel each other out.

In step S7, the spectrum is then evaluated in order to determine the fat content in the liver, namely in particular the fat proportion in relation to the overall signal in the spectrum, in other words in particular fat and water. As a result of the echo time in the ISIS sequence being extremely short, this method is very reliable and provides reproducible values relating to the fat content of the liver.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating magnetic resonance (MR) spectroscopy data from a volume of interest in the body of a subject, comprising:
   (a) operating an MR scanner, while the subject is situated in the MR scanner, to acquire image data, selected from the group consisting of one-dimensional image data and two-dimensional image data, from an examination region of the MR scanner in which an organ affected by breathing of the subject is present;
   (b) providing said image data to a processor and, in said processor, automatically evaluating said image data to determine a position of the organ;
   (c) repeating (a) and (b) until the position of the organ is within a predetermined region;
   (d) operating said MR scanner to proceed through at least one of eight acquisition cycles of an ISIS sequence to acquire magnetic resonance spectroscopy data from the volume of interest of the subject;
   (e) repeating (a) through (d) until all eight acquisition cycles of said ISIS sequence have been executed; and
   (f) in said processor, reconstructing a spectrum from the magnetic resonance spectroscopy data acquired from said eight acquisition cycles of said ISIS sequence, and making said spectrum available in electronic form at an output of said processor.

2. A method as claimed in claim 1 wherein said volume of interest is in the liver of said subject, and comprising:
   (g) evaluating said spectrum in said processor to determine a fat content in the liver.

3. A method as claimed in claim 2 comprising determining said fat content as a ratio between a fat signal in said spectrum, and a sum of a water signal in said spectrum and said fat signal in said spectrum.

4. A method as claimed in claim 1 comprising operating said MR scanner to acquire navigator signals from the subject, representing said breathing, and triggering each cycle of said ISIS sequence with a respective navigator signal.

5. A method as claimed in claim 1 wherein said organ affected by breathing is the diaphragm of the subject.

6. A method as claimed in claim 1 comprising allowing said subject to breath freely during acquisition of said magnetic resonance spectroscopy data in said cycles of said ISIS sequence.

7. A method as claimed in claim 1 wherein said image data are two-dimensional image data, and comprising operating said MR scanner to acquire said two-dimensional image data using a rapid gradient echo sequence having a low resolution and a small flip angle.

8. A method as claimed in claim 1 comprising operating said MR scanner in said ISIS sequence to radiate three slice-selective 180° pulses that each excite nuclear spins in a respective slice of the subject, the respective slices, in combination, comprising said volume of interest.

9. A method as claimed in claim 1 comprising operating said MR scanner in said ISIS sequence by radiating three slice-selective 180° pulses in succession, with the respective pulses being deactivated differently in the respective eight acquisition cycles and, after said three slice-selective 180° pulses, radiating a non-slice-selective radio-frequency pulse, and thereafter acquiring an FID signal from the subject.

10. A method as claimed in claim 1 comprising operating said MR scanner in said ISIS sequence to radiate different combinations of up to three slice-selective 180° pulses in succession in the respective eight acquisition cycles, and thereafter radiating a non-selective radio-frequency pulse and acquiring an FID signal from the subject, with respective FID signals of the respective eight acquisition cycles being mathematically combined, by adding or subtraction, to produce a signal originating from said volume of interest.

11. A method as claimed in claim 1 comprising acquiring said magnetic resonance spectroscopy data in each cycle with an echo time of less than 1 ms.

12. A method as claimed in claim 1 comprising acquiring said magnetic resonance spectroscopy data in each cycle with an echo time of less than 0.5 ms.

13. A method as claimed in claim 1 comprising, before (a), positioning the subject in the MR scanner and acquiring at least one sectional image through the body of the subject by rapid MR imaging, and positioning the examination region and the volume of interest using said at least one sectional image.

14. A magnetic resonance (MR) apparatus comprising:
   an MR scanner;
   a control computer configured to (a) operate said MR scanner, while the subject is situated in the MR scanner, to acquire image data, selected from the group consisting of one-dimensional image data and two-dimensional image data, from an examination region of the MR scanner in which an organ affected by breathing of the subject is present;
   said control computer being configured to (b) automatically evaluate said image data to determine a position of the organ;
   said control computer being configured to (c) repeat (a) and (b) until the position of the organ is within a predetermined region;
   said control computer being configured to (d) operate said MR scanner to proceed through at least one of eight acquisition cycles of an ISIS sequence to acquire magnetic resonance spectroscopy data from the volume of interest of the subject;
   said control computer being configured to (e) repeat (a) through (d) until all eight acquisition cycles of said ISIS sequence have been executed; and
   said control computer being configured to (f) reconstruct a spectrum from the magnetic resonance spectroscopy data acquired from said eight acquisition cycles of said ISIS sequence, and to make the spectrum available in electronic form at an output of said control computer.

15. A non-transitory, computer-readable data storage medium encoded with programming instructions, said storage medium being loaded into a control computer of a magnetic resonance (MR) apparatus, that also comprises an MR scanner, and said programming instructions causing said control computer to:
   (a) operate said MR scanner, while the subject is situated in the MR scanner, to acquire image data, selected from the group consisting of one-dimensional image data and two-dimensional image data, from an examination region of the MR scanner in which an organ affected by breathing of the subject is present;
(b) automatically evaluate said image data to determine a position of the organ;
(c) repeat (a) and (b) until the position of the organ is within a predetermined region;
(d) operate said MR scanner to proceed through at least one of eight acquisition cycles of an ISIS sequence to acquire magnetic resonance spectroscopy data from the volume of interest of the subject;
(e) repeat (a) through (d) until all eight acquisition cycles of said ISIS sequence have been executed; and
(f) reconstruct a spectrum from the magnetic resonance spectroscopy data acquired from said eight acquisition cycles of said ISIS sequence, and make said spectrum available in electronic form at an output of said processor.

\* \* \* \* \*